(12) United States Patent
Van Sprang et al.

(10) Patent No.: US 8,121,166 B2
(45) Date of Patent: Feb. 21, 2012

(54) SIDE-EMITTING LED LIGHT SOURCE FOR BACKLIGHTING APPLICATIONS

(75) Inventors: Hendrik Adrianus Van Sprang, Eindhoven (NL); Jan De Graaf, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 12/682,261

(22) PCT Filed: Oct. 10, 2008

(86) PCT No.: PCT/IB2008/054172
§ 371 (c)(1),
(2), (4) Date: Apr. 9, 2010

(87) PCT Pub. No.: WO2009/050623
PCT Pub. Date: Apr. 23, 2009

(65) Prior Publication Data
US 2010/0246626 A1    Sep. 30, 2010

(30) Foreign Application Priority Data
Oct. 16, 2007    (EP) .................................... 07118575

(51) Int. Cl.
*H01S 5/00*    (2006.01)

(52) U.S. Cl. ......... 372/50.1; 372/50.12; 257/98; 362/84

(58) Field of Classification Search .................. 372/50.1, 372/50.12; 257/98; 362/84
See application file for complete search history.

(56) References Cited

U.S. PATENT DOCUMENTS

| 5,579,429 | A | 11/1996 | Naum |
| 2006/0193149 | A1 | 8/2006 | Noh et al. |
| 2006/0198418 | A1* | 9/2006 | Hama et al. ................... 372/108 |
| 2006/0239000 | A1 | 10/2006 | McDermott, Sr. et al. |
| 2006/0273337 | A1 | 12/2006 | Han et al. |
| 2007/0145383 | A1* | 6/2007 | Rho et al. ........................ 257/79 |
| 2007/0188677 | A1 | 8/2007 | Souk et al. |

FOREIGN PATENT DOCUMENTS

| EP | 1643278 A1 | 4/2006 |
| EP | 1930751 A2 | 6/2008 |
| EP | 1988331 A1 | 11/2008 |
| WO | 2007023412 A1 | 3/2007 |
| WO | 2007097437 A1 | 8/2007 |

OTHER PUBLICATIONS

Philips Press Release (PR73): "Philips Lumileds Thin Film Flip Chip Technology Delivers the Highest Performance LEDs for Lighting Applications"; Jul. 10, 2007, Found At http://www.lumileds.com/newsand events/releases/PR73.pdf.

* cited by examiner

*Primary Examiner* — Yuanda Zhang
(74) *Attorney, Agent, or Firm* — John F. Salazar; Mark L. Beloborodov

(57) ABSTRACT

This invention relates to a side-emitting light device comprising two sub-assemblies which are optically bonded together. Each sub-assembly comprises a substrate, at least one light source disposed on the substrate, and a luminescent plate optically bonded with the at least one light source. The light source emits light of a wavelength capable of exciting luminescence light from the luminescent plate. The two sub-assemblies are arranged having the free surface of the luminescent plates facing each other. The side-emitting light device is for instance applicable for light sources comprising naked dies arranged with Thin Film Flip Chip (TFFC) technique or laser diodes.

10 Claims, 6 Drawing Sheets

SIDE-EMITTING LED LIGHT SOURCE FOR BACKLIGHTING APPLICATIONS

FIELD OF THE INVENTION

The present invention relates to the field of light devices. More particularly the invention relates to a side-emitting light device and a method for manufacturing such a side-emitting light device.

BACKGROUND OF THE INVENTION

State of the art side-emitting light emitting diode devices, LED devices, are commonly used in mobile backlighting applications. The basic structure of a side-emitting LED device in prior art is a substrate with a LED chip and electrical connections, a light guide which is provided with a reflecting structure or top coating which reflects light emitted by the LED chip within the light guide such that the emitted light exits the LED package through a side surface thereof.

US 2006/0273337 A1 discloses a side-emitting LED package and a manufacturing method thereof. The side-emitting LED package comprises the basic structure as described above with the light guide constituted by a moulded part having an upper surface with a centre thereof depressed concavely, which upper surface covers and protects the substrate and the light source. Furthermore, the upper surface is covered by a reflection layer. The reflection layer causes light emitted by the light source to reflect sideward from the moulded part which forms a light transmitting surface in the side directions with reference to the substrate.

The light that exits a side surface of a prior art side-emitting LED as exemplified above, often has an uneven angular distribution. One solution for solving this problem is proposed in the prior art document US 2006/0239000 A1, which discloses a side-emitting LED package in which two individual side-emitting LEDs of basic structure are mounted head-to-head to complement the beam spread from each individual side-emitting LED. However, the mounting of the individual side-emitting LEDs involves mechanically complicated and space consuming constructions.

SUMMARY OF THE INVENTION

It is an object of the present invention to provide a side-emitting light device, and a method for manufacturing such a device, that alleviates the above-mentioned drawbacks of the prior art.

This object is achieved by a device and a method according to the present invention as defined in the claims.

Thus, in accordance with a first aspect of the present invention according to claim 1, there is provided a side-emitting light device comprising two sub-assemblies, each sub-assembly comprising: a substrate, at least one light source disposed on the substrate, and a luminescent plate having a first surface and an opposite second surface. The first surface is optically bonded with the at least one light source. The at least one light source emits light of a wavelength capable of exciting luminescence light from the luminescent plate. The two sub-assemblies are arranged having the second surfaces of the luminescent plates optically bonded together.

Hence, there is provided a side-emitting light device with light sources that excite luminescence light from luminescent plates, which device consists of two sub-assemblies. The sub assemblies are symmetrically configured, and can be separately examined in the manufacturing process before being optically bonded together. This is advantageous for detecting manufacturing defects before the device is mounted. Furthermore, when having two sets of at least one light source in a symmetrical configuration, face-to-face, the light that exits the side-emitting light device is compensated with respect to the light spreading properties of the individual set of at least one light source. The intensity of light in proportion to the required light device area is also doubled as compared to using a side-emitting light device of ordinary configuration.

In accordance with an embodiment of the device, as defined in the claims, the luminescent plate is a luminescent ceramic platelet. A luminescent ceramic platelet provides a material which is suitable for absorbing light produced by the light sources and subsequently, as a result of the photo-excitation, for emitting luminescent light. The luminescent ceramic platelet acts as a light guide and may be optimized with respect to transparency and translucency properties.

In accordance with an embodiment of the device, as defined in the claims, the at least one light source is formed by a naked light emitting diode die.

By using naked dies that are optically bonded with the luminescent plates the light extraction from the dies has a high efficacy. Furthermore, symmetric color emission and over all angles from the side surfaces of the device is obtained.

In accordance with an embodiment of the device, as defined in the claims, the at least one light source is formed by a laser diode, which is advantageous for high power applications and narrow bandwidth applications.

In accordance with an embodiment of the device, as defined in the claims, optical glue is used to optically bond said luminescent plate to said light source, which provides an advantageous optical bond and assembling of the luminescent plate and the light source. The light of the light sources is guided via the optical glue into the luminescent plate, providing a high light coupling between the light sources and the luminescent plate. Furthermore, optimizing the optical glue index of refraction relative to the luminescent plates and said light sources an optimal light extraction from the light sources to the luminescent plates is achieved. By optimizing the light extraction from the light sources into the luminescent plates, the light efficiency of the device is increased.

In accordance with an embodiment of the device, as defined in the claims, optical glue is used to optically bond the luminescent plates, thus providing a good optical coupling and assembling between the two plates which is advantageous. Furthermore, optical glue with index of refraction relative to said luminescent plates that provides total internal reflection of light generated in said luminescent plates, will decrease loss of light due to refraction in the boundaries between the luminescent plates and the optical glue. In accordance with an embodiment of the device, as defined in claim 7, the optical glue is inorganic.

In accordance with an embodiment of the device, as defined in the claims, the luminescent plates are selected from a group consisting of white light emitting materials, red light emitting materials, green light emitting materials, blue light emitting materials, and amber light emitting materials, which is advantageous when utilizing the device in various display applications.

In accordance with an embodiment of the device, as defined in the claims, the device further comprises a wavelength specific optical layer arranged on the light sources or the luminescent plates, which layer is advantageous for selecting wavelength specific optical properties of the optical coupling between the light sources and the optical glue and the substrate and the optical glue, respectively.

In accordance with an embodiment of the device, as defined in the claims, the wavelength specific optical layer is transparent for light generated by said light source and reflecting for light generated in the luminescent plate, which will further increase the light efficiency of the device.

In accordance with an embodiment of the device, as defined in the claims, the device further comprises a heat sink arranged in connection with said substrates of the device. The heat sink provides heat spreading functionality to ensure the same thermal conditions for both sub-assemblies of the device.

In accordance with an embodiment of the device, as defined in the claims, only one luminescent plate is used, which still provides a symmetric device but which requires a shorter manufacturing process, which is advantageous.

In accordance with an embodiment of the device, as defined in the claims, the light-sources of said sub-assemblies are electrically connected, which makes the powering scheme of the sub-assemblies more efficient.

In accordance with an embodiment of the device, as defined in the claims, the substrate is opaque or reflecting. When the substrates of the sub-assemblies have intrinsic opaque properties or are reflecting, in contrast to prior art side-emitting LEDs, the device according to the present invention does not require a top mirror to block direct light and/or reflect light in a lateral direction to increase the light intensity out of the device.

In accordance with a second aspect of the present invention according to the claims, there is provided a method of manufacturing a side-emitting light device comprising:

for two sub-assemblies:
  providing a substrate,
  disposing at least one light source on the substrate, and
  optically bonding a luminescent plate on the at least one light source, and then:
assembling the two sub-assemblies such that the luminescent plates are optically bonded together.

Thus, there is provided a method in which two sub-assemblies are first manufactured before assembling, which is advantageous as it allows for inspection of the separate sub-assemblies before mounting. If the two sub-assemblies are chosen to be identical the manufacturing process becomes more effective, as the sub-assemblies may be produced in the same manufacturing line.

In accordance with an embodiment of the method, as defined in the claims, the step of assembling comprises optically bonding said luminescent plates, which is advantageous.

In accordance with an embodiment of the method, as defined in the claims, the optical bonding is done by agglutinating with optical glue.

In accordance with an embodiment of the method, as defined in the claims, the method further comprises a step of providing a wavelength specific optical layer between said light source and said luminescent plate.

In accordance with an embodiment of the method, as defined in the claims, the method further comprises a step of providing an electrical connection between the sub-assemblies.

The invention is based on an insight that a side-emitting light device constituted by two optically bonded sub-assemblies, which each comprises at least one light source mounted on a substrate and which light sources are optically bonded with a luminescent plate, which luminescent plate faces the corresponding other sub-assemblies luminescent plate, results in a symmetric, high power, high efficacy side-emitting light device with uniform and symmetric color emission from the side surfaces over all angles.

These and other aspects, features, and advantages of the invention will be apparent from and elucidated with reference to the embodiments described hereinafter.

BRIEF DESCRIPTION OF THE DRAWINGS

The invention will now be described in more detail and with reference to the appended drawings in which:

FIG. 1 *b*) illustrates a schematic cross-sectional view of an embodiment of a side-emitting light device according to the present invention.

DESCRIPTION OF PREFERRED EMBODIMENTS

Figure 1A:
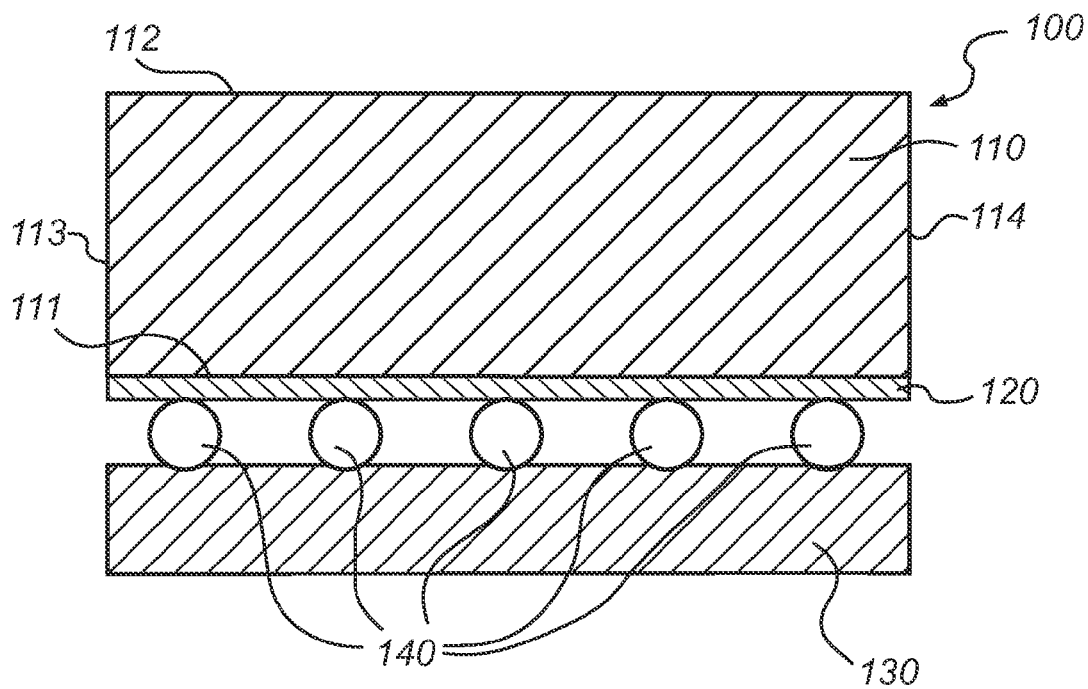
FIG. 1 *a*) illustrates a schematic cross-sectional view of a sub-assembly of an embodiment of a device according to the present invention.

In a first aspect of the present invention there is provided a side-emitting light device comprising two sub-assemblies which are assembled such that a unitary side-emitting light device is formed. FIG. 1*a*) illustrates a sub-assembly 100 which comprises a substrate 130 on which one or more light sources 140 are provided. The light sources 140 are optically bonded with a luminescent plate 110. The luminescent plate has a first surface 111 and a second surface 112. The optical bond is arranged such that light produced in the light sources 140 is guided to the luminescent plate 110, in which light is generated by means of photo luminescence, i.e. the light from the light sources is absorbed in and reemitted at longer wavelengths by the luminescent plate material. Thus, the light sources 140 and the material in the luminescent plate 110 must be matched, such that the light sources 140 emit light of a wavelength capable of exciting luminescence light from the luminescent plate 110.

In an illustrative non limiting embodiment which will be described hereinafter, the substrate 130 is ceramic. Light sources in the form of LEDs are arranged on the surface of the substrate 130. The light sources 140 are mounted using Thin Film Flip Chip (TFFC) technology for light emitting diodes. This technology allows for placing the anode and cathode apart from the light output path of the light sources, leaving the naked dies available for an unobstructed optical coupling of light produced in the dies. This allows for maximum light extraction from the dies, and in turn in a high light efficacy of the device. Thin Film Flip Chip (TFFC) technology will not be described in further detail here.

In an embodiment of the side-emitting light device 200 the light sources 140 are realized with laser diodes. However, for simplicity only LED light sources are discussed in the following non-limiting exemplifying embodiments.

In this embodiment the light sources, i.e. the naked dies 140, are optically bonded with a luminescent ceramic platelet 110. The optical bonding between the light sources 140 and the luminescent ceramic platelet 110 consists of optical glue, which is illustrated as a layer 120 in the figures.

Figure 1B:
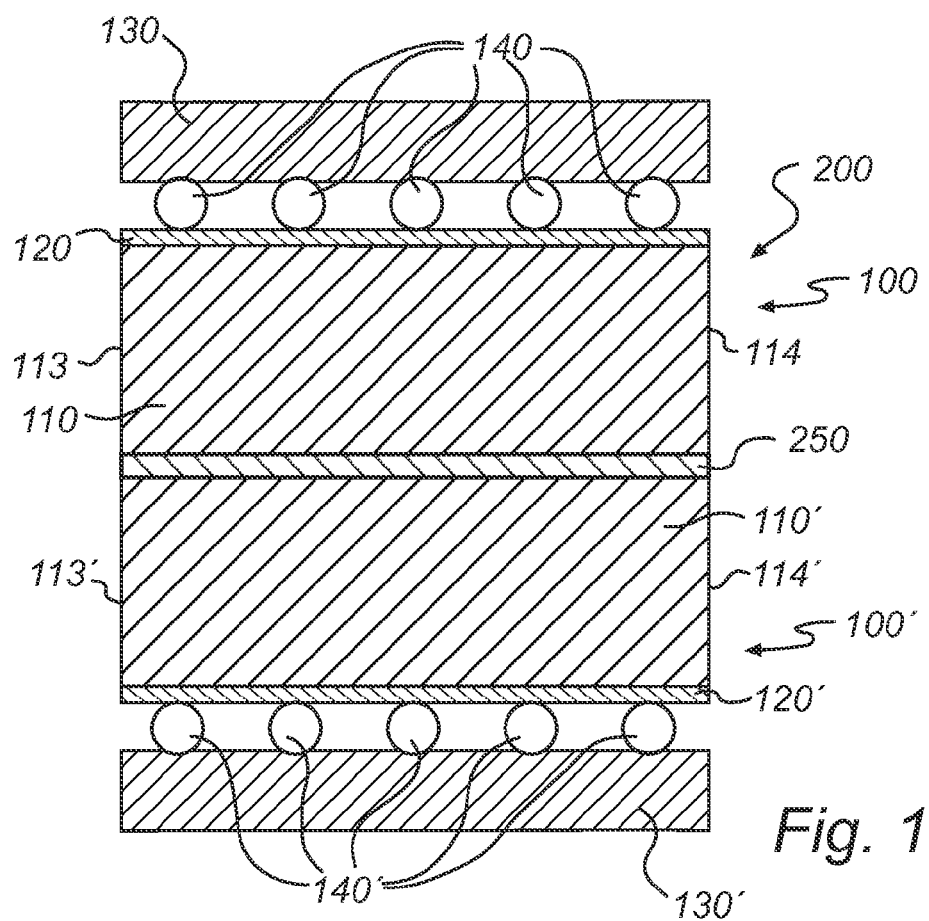

In FIG. 1 b) an embodiment of the side-emitting light device 200 according to the present invention is illustrated. Two sub-assemblies 100, 100', as described above, are arranged having their respective second surfaces 112, 112' of the luminescent plates 110, 110' optically bonded together. The optical bonding consists of optical glue and is illustrated as a layer 250.

Figure 3:
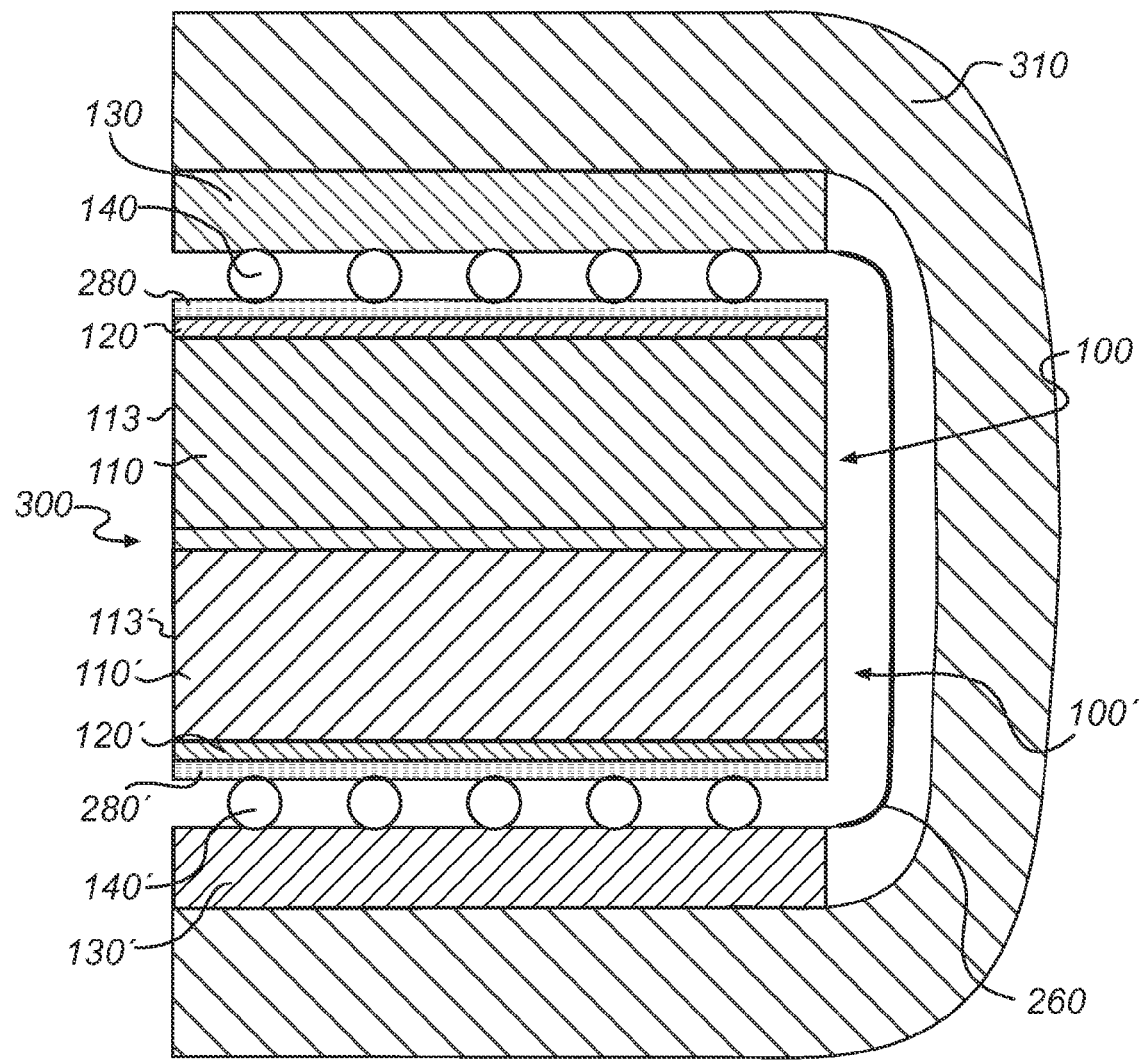
FIG. 3 illustrates an embodiment of a side-emitting light device according to the present invention, which embodiment comprises a heat sink.
Figure 4A:
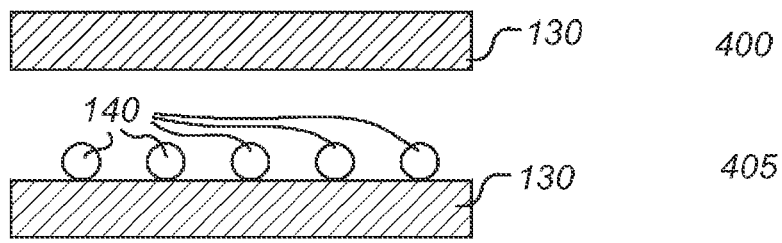
FIGS. 4*a*-4*h* depicts schematic illustrations alternative embodiments of the main steps of a method of manufacturing a side-emitting light device according to the present invention.
Figure 4B:
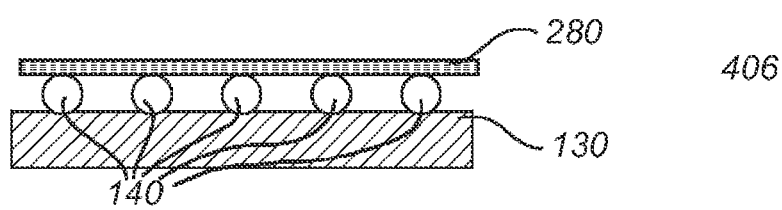
Figure 4C:
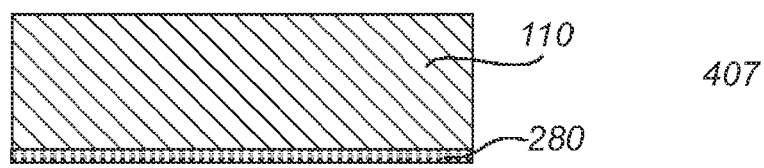
Figure 4D:
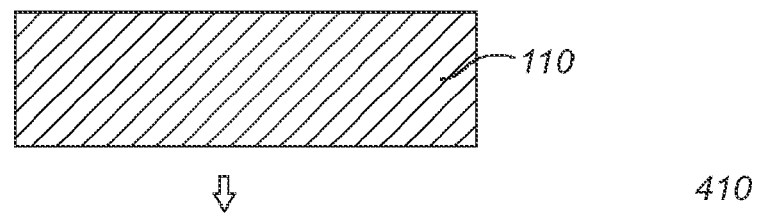
Figure 4E:
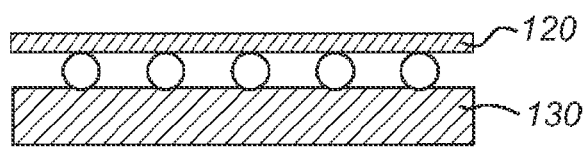
Figure 4E:
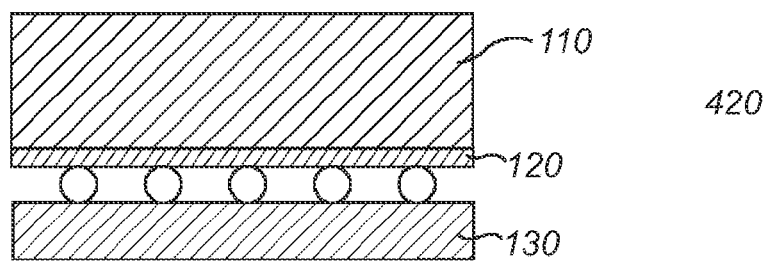
Figure 4F:
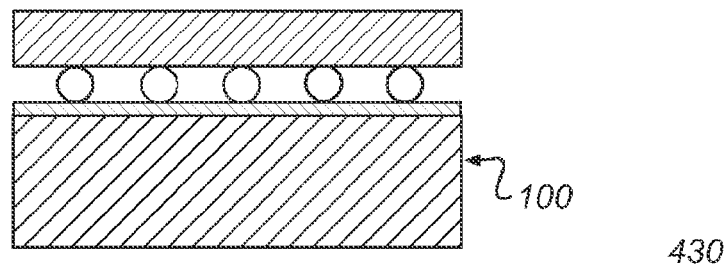
Figure 4F:
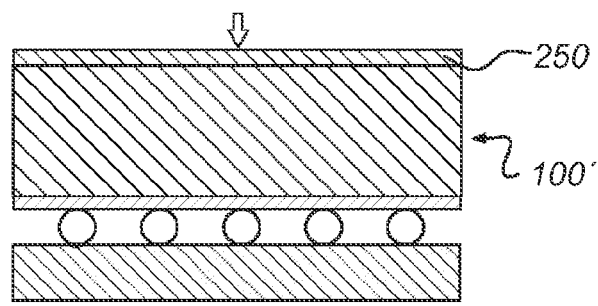
Figure 4G:
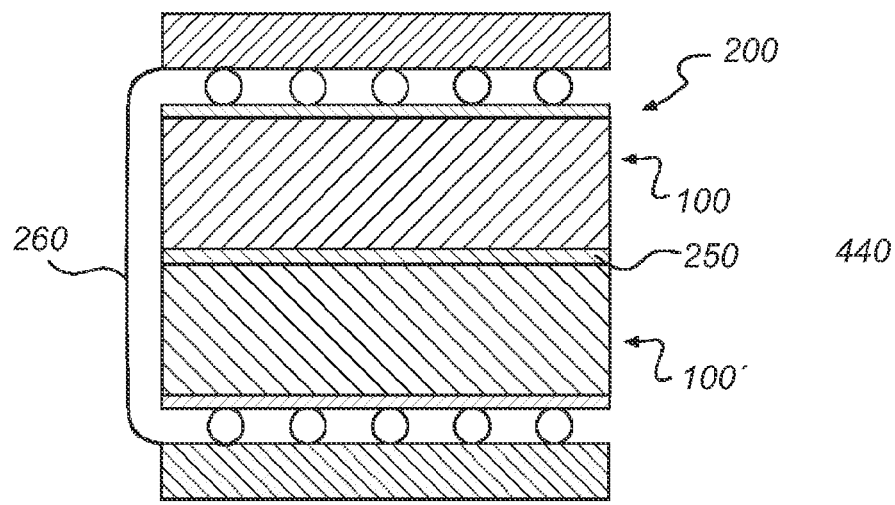
Figure 4H:
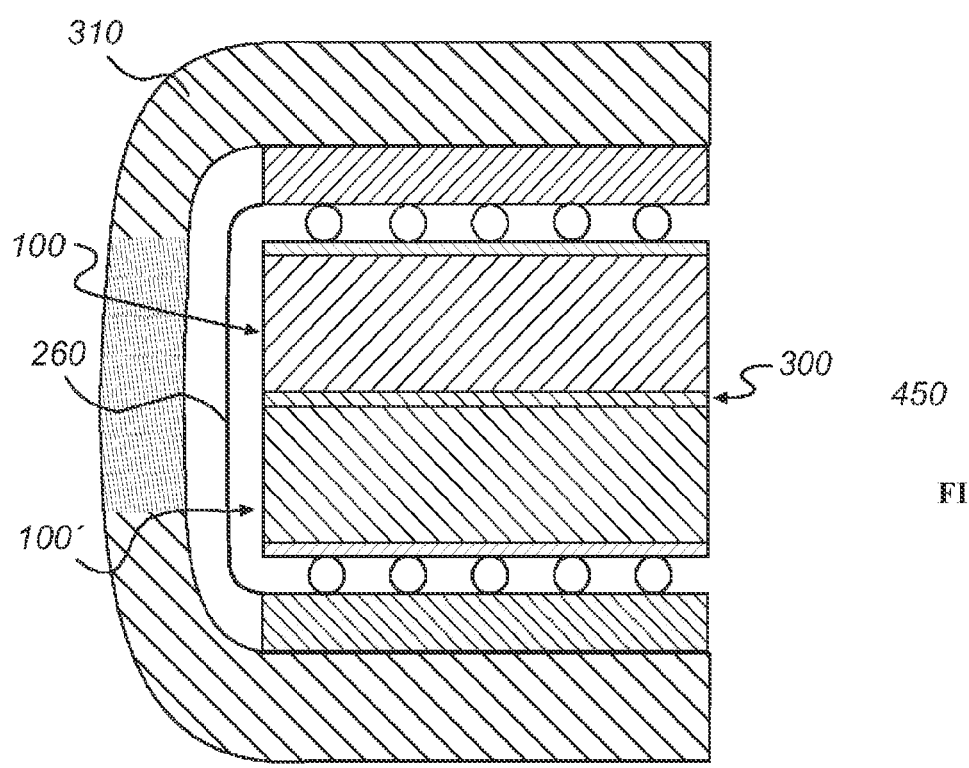

In an embodiment of the side-emitting light device 200, the light sources 140, 140' of said sub-assemblies 100, 100' are electrically connected, which is illustrated as an electrical connector 260, see e.g. FIG. 3. In an embodiment of the present invention, the luminescent ceramic platelets 110 are optimized regarding transparent and/or translucent properties. When forming a luminescent ceramic, a powder phosphor (or other suitable material) is exposed to high pressure and heat to sinter the phosphor particles into a ceramic body. The particles are then closely packed and stick together to form a rigid agglomerate of particles. The optical behavior of the resulting luminescent ceramic is that of tightly packed individual phosphor particles with small optical discontinuities at the interface between the individual phosphor particles. This gives an optically almost homogenous material which has the same refractive index as the phosphor material forming the luminescent ceramic. As there is very little material of a different refractive index between the individual phosphor particles the luminescent ceramic is transparent or translucent.

Furthermore, the luminescent plates 110 used may be white light emitting materials, red light emitting materials, green light emitting materials, blue light emitting materials, and amber light emitting materials. As the skilled man will recognize, materials emitting light of any other color is also possible to use, and are to be considered within the scope of the invention. When designing the light properties of the side-emitting light device 200 to match a certain application or the required color of emission, the configuration of the luminescent plates is selected with reference to the thickness of the luminescent plate and the concentration of luminescent centers within the luminescent material.

The optical glue in layers 120 and 250 is in an embodiment inorganic. Inorganic adhesives with a high index provide a good optical coupling with refractive indexes that are close to the refractive indexes of the luminescent ceramic material. Alternatively, the gluing may be done by using sol-gel glasses, or ultrathin layers of organic or hybrid organic—inorganic adhesives as epoxy or silicone.

In an advantageous embodiment of the device, the optical glue has an index of refraction relative to the luminescent plates 110 and the light sources 140 that is adapted for optimal light extraction from the light sources to the luminescent plates. Also, choosing the index of refraction relative to the luminescent plates to obtain total internal reflection of the light generated in the luminescent plates 110 provides a high efficiency of the side-emitting light device.

Characteristics of the optical glue, such characteristics being index of refraction, glue line thickness, transparency, and translucency, are preferably adapted for the color of light generated in the luminescent plates.

Figure 2A:
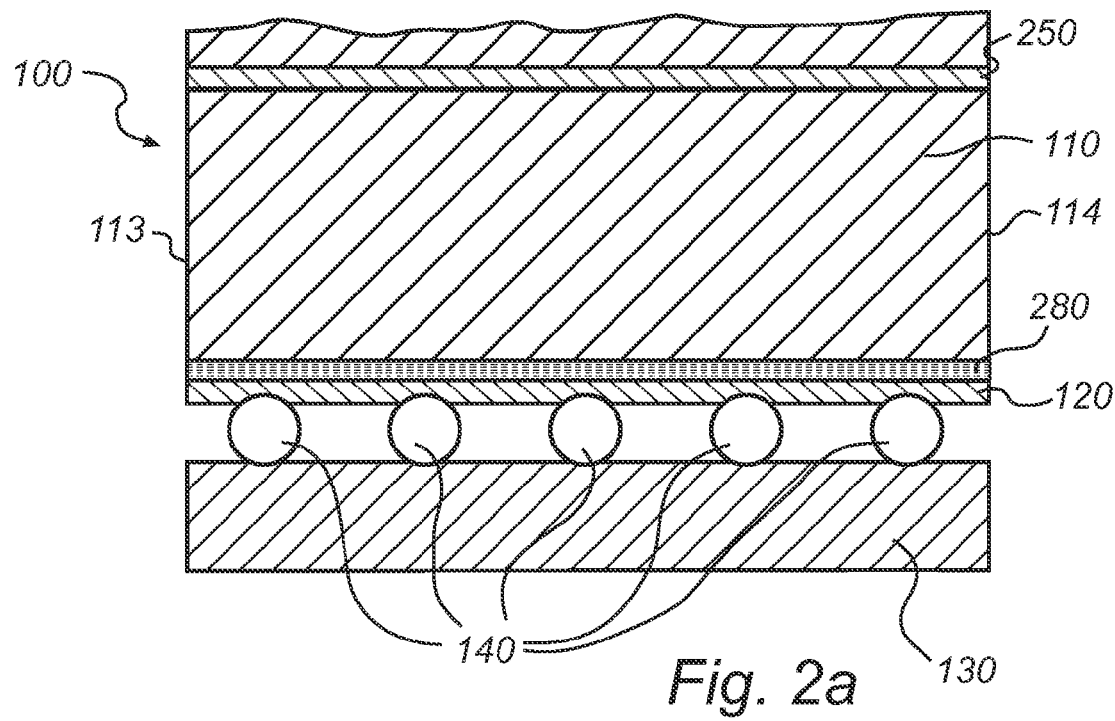
FIG. 2 *a*) and *b*) illustrates schematic cross-sectional views of two embodiments of the side-emitting light device according to the present invention.
Figure 2B:
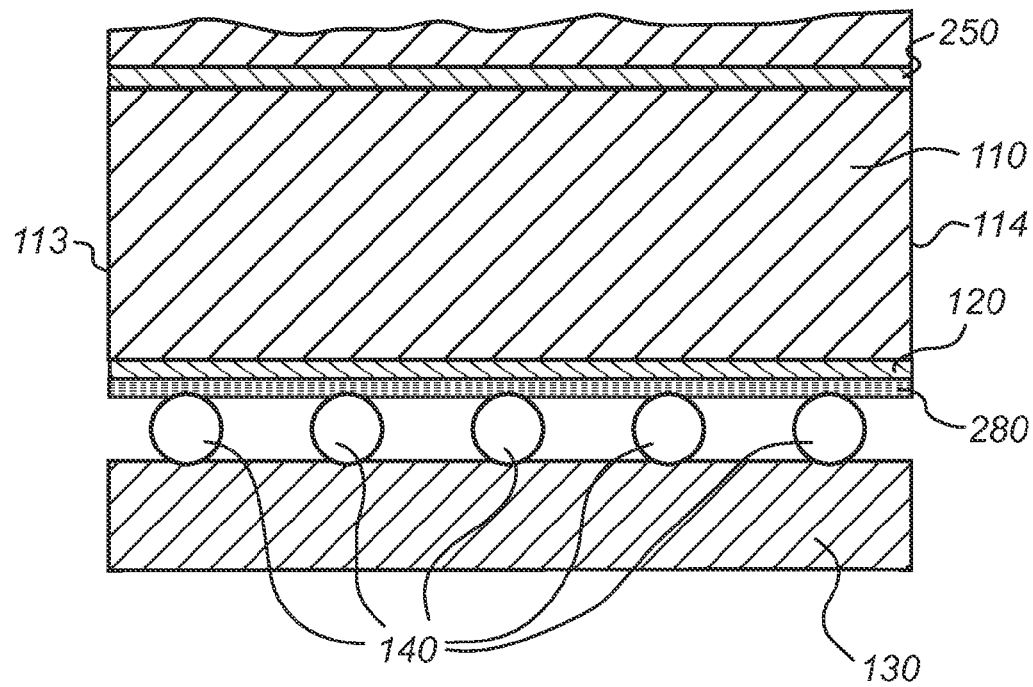

In alternative embodiments of the side-emitting light device a wavelength specific optical layer 280, as depicted in FIG. 2 is arranged in the device. In FIG. 2 a) the wavelength specific optical layer 280 is arranged on the luminescent plate 110, and more specifically on the surface of the luminescent plate 110, which surface faces the light sources 140. The wavelength specific optical layer 280 is in another embodiment arranged on top of the light sources 140, see FIG. 2b), i.e. on the bonded surface of the LEDs. Thus, in both embodiments the layer 280 is arranged between the light sources 140 and the luminescent plate 140. The wavelength specific optical layer 280 constitutes a wavelength specific mirror which is transparent for the excitation wavelength, i.e. the light generated in the light sources 140, and reflective for the light generated in the luminescent plates 110. In this way light from the light sources 140 on the substrate 130 may enter the luminescent plate 110 to excite the plate material and induce photo luminescence in the luminescent plate 110. The generated light from this photo luminescence process is then reflected against the wavelength specific optical layer 280 and back into the luminescent plates 110, and may subsequently exit the side-emitting light device through the side surfaces 113 and 114 of the luminescent plates 110. This decreases backscattering losses which may otherwise occur within the device. The wavelength specific optical layer 280 is realized utilizing a photonic structure.

In an alternative embodiment the wavelength specific optical layer 280 is realized as a dichroic mirror, in which case either the luminescent plate 110 or the top surface of the light sources 140 is provided with a multi-layer stack 280 comprising at least two materials with a difference in refractive index. Such a stack is known as an optical filter. An example of such dichroic mirror (i.e. the stack) 280 is shown in Table 1, where the materials used are Silicon dioxide ($SiO_2$) and Niobium pentoxide ($Nb_2O_5$). These materials are both well known optical materials. The intention is to transmit blue light emitted in the light sources 140, which light for this dichroic mirror has to be converted to red light in the luminescent plates 110, 110'. This red light is then reflected on the top and bottom surface of the luminescent plates 110, 110' so that it may only escape through one of the side-surfaces 113 or 114 of the device. This type of dichroic mirror 280 allows for a large range of angles of the light (in this example blue light) from an excitation source to be transmitted through the dichroic mirror 280 into a luminescent plate, while reflecting the converted luminescent light (in this example red light) and hindering the luminescent light to pass back through the dichroic mirror 280. In general, dichroic mirrors can be designed and applied for transmitting blue or UV light and reflecting any higher wavelength than blue or UV.

TABLE 1

| Layer | Material | d(nm) |
|---|---|---|
| Medium | Air | |
| 1 | Nb2O5 | 96.48 |
| 2 | SiO2 | 84.69 |
| 3 | Nb2O5 | 187.36 |
| 4 | SiO2 | 107.11 |
| 5 | Nb2O5 | 91.94 |
| 6 | SiO2 | 80.29 |
| 7 | Nb2O5 | 85.36 |
| 8 | SiO2 | 99.42 |
| 9 | Nb2O5 | 86.72 |
| 10 | SiO2 | 84.09 |
| 11 | Nb2O5 | 88.44 |
| 12 | SiO2 | 50.07 |
| 13 | Nb2O5 | 5.61 |
| 14 | SiO2 | 48.66 |
| 15 | Nb2O5 | 187.58 |
| 16 | SiO2 | 44.48 |
| 17 | Nb2O5 | 8.52 |
| 18 | SiO2 | 115.28 |
| 19 | Nb2O5 | 13.16 |
| 20 | SiO2 | 38.31 |
| 21 | Nb2O5 | 184.25 |
| 22 | SiO2 | 32.29 |
| 23 | Nb2O5 | 6.63 |
| 24 | SiO2 | 94.12 |

TABLE 1-continued

| Layer<br>Medium | Material<br>Air | d(nm) |
|---|---|---|
| 25 | Nb2O5 | 82.9 |
| 26 | SiO2 | 140.25 |
| 27 | Nb2O5 | 89.84 |
| Substrate | luminescent ceramic plate | |

FIG. 3 illustrates an embodiment of the side-emitting light device 300. Here a heat sink 310 is arranged in connection with a side-emitting light device 200. The heat sink 310 serves the purpose of spreading of heat produced externally and internally by the device 200 to achieve uniform thermal conditions for the two sub-assemblies 100, 100' and more specifically for the two sets of light sources 140, 140'. The heat sink also serves the purpose of reflecting light from the device and in addition the heat sink 310 also serves as a wiring support for electrical connections (not shown) to power the device 200. The heat sink 310 may consist of any material that posses proper reflecting and heat spreading properties, e.g. aluminum, or a combination of a material for heat spreading and either a specular reflective coating like aluminum, silver, or a diffuse (white) reflective coating.

In alternative embodiments of the invention, the substrate 130 of each sub-assembly has intrinsic opaque properties or is reflecting. Light produced in the device is then at least hindered or reflected on the surfaces of the substrates 130 so that light may only escape through one of the side-surfaces 113 or 114 of the device.

A second aspect of the present invention is a method of manufacturing a side-emitting light device, which is illustrated in a step-by-step illustration in FIGS. 4a-4h. Steps 400 to 420 depicts in a schematic way the steps for manufacturing the separate sub-assemblies 100 of the side-emitting light device 200. Steps 430 to 440 show the final assembling of two sub-assemblies 100, 100'.

In the initial step 400 a substrate is provided. The substrate is equipped with electrodes and anodes (not shown) using Thin Film Flip Chip (TFFC) technology for light emitting diodes, such that in step 405 light sources 140 comprising of naked die light emitting diodes, are disposed on the substrate and electrically connected to the electrodes and anodes. In another embodiment the light sources comprises laser diodes or some other suitable light sources.

In one embodiment of the method, step 405 is immediately followed by step 410, in which the light sources 140 are optically bonded with a luminescent plate 110. First, a layer of optical glue 120 is dispensed on top of the light sources 140 by means of screen printing, spin coating or any other suitable dispensing method. The luminescent plate 110 is then attached to the layer of optical glue 120, and under pressure the optical glue is cured in a method suitable for the used glue. Depending on the glue, the curing may be done for instance by exposing the sub-assembly 100 to UV-light or heat for a suitable amount of time. The optical glue, besides fixating the luminescent plate 110 to the light sources 140 on the substrate 130, forms an optical bond between the light sources 140 and the luminescent plate 110. A complete sub-assembly 100 is shown in step 420.

In step 430 two sub-assemblies 100, 100' are assembled to form a side-emitting light device 200 by, in this exemplifying embodiment, first dispensing a layer of optical glue 250 on the upper surface 112 of a first sub-assembly 100. This is done in the same manner as described above for layer 120. The second sub-assembly 100' is then attached to first sub-assembly 100 by agglutinating, i.e. by pressing, the upper surface 112 of the second sub-assembly 100' onto the layer of optical glue 250. The optical layer 250 is then allowed to cure under appropriate curing conditions for the current glue. The curing conditions associated with the current glue may be e.g. pressure, temperature and/or type of radiation. Finally, in an alternative step 440, the side-emitting light device 200 is supplied with an electrical connector 260 between the light sources of the first sub-assembly 100 and the second sub-assembly 100'.

In an alternative embodiment the two sub-assemblies 100 and 100', are assembled using alternative suitable adhesive materials. The gluing may be done by using sol-gel glasses, or ultrathin layers of organic or hybrid organic—inorganic adhesives as epoxy or silicone.

In an alternative embodiment the method comprises an additional step of providing a wavelength specific optical layer 280, which is a photonic structure or a dichroic mirror. This additional step is represented as two steps 406 or 407 to indicate where in the method it can be performed. Step 406 is performed after disposing the light sources, i.e. after step 405, and the method then continues to step 410. When performing the method while instead of step 406 choosing to use step 407, step 407 is performed before applying the optical glue in step 410, i.e. between steps 405 and 410.

The additional step, 406 or 407, is performed by providing thin layers of material to form a multi-layer stack 280 comprising at least two materials with a difference in refractive index, (see Table. 1). When performing the method according to an embodiment utilizing step 406, the multi-layer stack 280 is applied upon the light sources. When performing the method according to an embodiment utilizing step 407, the multi-layer stack is applied directly on the luminescent plate 110 before the step of gluing the luminescent plate 110 with the light sources 140.

In an alternative embodiment the method further comprises a step 450 in which a heat sink 310 is provided to the side-emitting light device 200. In a non limiting example this is done by applying a heat sink 310 by mounting the device 200 in a suitably shaped piece of aluminium or other heat-spreading material.

In the examples above the light sources 140 are light emitting diodes, LEDs, that are mounted using Thin Film Flip Chip (TFFC), however the principle of the method is applicable for any suitable existing or future light sources and the scope of the claims should not be restricted to particularly naked die LEDs.

Above, embodiments of the side-emitting light devices according to the present invention as defined in the appended claims have been described. These should be seen as merely non-limiting examples. As understood by a skilled person, many modifications and alternative embodiments are possible within the scope of the invention, as defined by the appended claims.

It is to be noted, that for the purposes of this application, and in particular with regard to the appended claims, the word "comprising" does not exclude other elements or steps, that the word "a" or "an", does not exclude a plurality, which per se will be apparent to a person skilled in the art.

The invention claimed is:

1. A side-emitting light device comprising: a first sub-assembly, said first sub-assembly having a first substrate; at least one light source disposed on said first substrate; a first luminescent plate having a first surface and an opposite second surface, wherein said first surface of said first luminescent plate is optically bonded with said at least one light source of said first sub-assembly, and wherein said at least one light source of said first sub-assembly emits light of a wavelength capable of exciting luminescence light from said first luminescent plate; a second sub-assembly, said second sub-assembly having a second substrate; at least one light source disposed on said second substrate; a second luminescent plate having a first surface and an opposite second surface, wherein said first surface of said second luminescent plate is optically bonded with said at least one light source of said second sub-assembly; wherein said at least one light source of said second sub-assembly emits light of a wavelength capable of exciting luminescence light from said second luminescent plate; wherein said first and said second sub-assembly are arranged having said second surfaces of said first and said second luminescent plates optically bonded together in a face to face relationship with an optical binding agent so that said at least one light source on said first substrate is facing said at least one light source on said second substrate with said optical binding agent interposed therebetween.

2. The device according to claim 1, wherein each of said first and said second sub-assembly luminescent plates is a luminescent ceramic platelet.

3. The device according to claim 2, wherein said at least one light source of said first and said second sub-assembly is a naked light emitting diode die.

4. The device according to claim 2, wherein said at least one light source of said first and said second sub-assembly is a laser diode.

5. The device according to claim 1, wherein said luminescent plates of said first and said second sub-assembly are selected from a group consisting of white light emitting materials, red light emitting materials, green light emitting materials, blue light emitting materials, and amber light emitting materials.

6. The device according to claim 1, further comprising a wavelength specific optical layer arranged on said light sources of both of said first and said second sub-assembly or said luminescent plates of both of said first and said second sub-assembly.

7. The device according to claim 6, wherein said wavelength specific optical layer is transparent for light generated by said light sources of said first and said second sub-assembly and reflecting for light generated in the luminescent plates of both of said first and said second sub-assembly.

8. The device according to claim 1, further comprising a heat sink arranged in a U-shaped connection with said first and said second substrates of the device.

9. The device according to claim 1, wherein the light-sources of said first and said second sub-assembly are electrically connected.

10. The device according to claim 1, wherein said first and said second substrates are opaque or reflecting.

\* \* \* \* \*